(12) United States Patent
Kim et al.

(10) Patent No.: US 10,069,050 B2
(45) Date of Patent: Sep. 4, 2018

(54) LIGHT EMITTING DEVICE, LIGHT EMITTING DEVICE PACKAGE INCLUDING THE DEVICE, AND LIGHTING APPARATUS INCLUDING THE PACKAGE

(71) Applicant: LG INNOTEK CO., LTD., Seoul (KR)

(72) Inventors: Sung Phil Kim, Seoul (KR); Ji Young Jung, Seoul (KR); Yang Hyun Joo, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 15/274,299

(22) Filed: Sep. 23, 2016

(65) Prior Publication Data

US 2017/0092824 A1   Mar. 30, 2017

(30) Foreign Application Priority Data

Sep. 25, 2015   (KR) .................. 10-2015-0136211
Sep. 13, 2016   (KR) .................. 10-2016-0117942

(51) Int. Cl.
*H01L 33/00* (2010.01)
*H01L 33/58* (2010.01)
*H01L 33/62* (2010.01)
*H01L 25/075* (2006.01)

(52) U.S. Cl.
CPC .......... *H01L 33/58* (2013.01); *H01L 25/0753* (2013.01); *H01L 33/62* (2013.01)

(58) Field of Classification Search
CPC .......... H01L 2224/48091; H01L 33/58; H01L 2924/181; H01L 33/56; H01L 33/502; H01L 33/62; H01L 2933/0058; H01L 2924/16195; H01L 51/5262; H01L 51/5268; H01L 51/5275; H01L 33/486
See application file for complete search history.

(56) References Cited

U.S. PATENT DOCUMENTS

| | | | |
|---|---|---|---|
| 2009/0008662 A1* | 1/2009 | Ashdown | H01L 25/0753 257/98 |
| 2009/0250714 A1* | 10/2009 | Yun | H01L 33/50 257/98 |
| 2010/0176407 A1* | 7/2010 | Lee | H01L 33/483 257/98 |

(Continued)

FOREIGN PATENT DOCUMENTS

| | | |
|---|---|---|
| KR | 10-0665219 B1 | 1/2007 |
| KR | 10-1223411 B1 | 1/2013 |

*Primary Examiner* — Frederick B Hargrove
(74) *Attorney, Agent, or Firm* — Birch, Stewart, Kolasch & Birch, LLP

(57) ABSTRACT

A light emitting device package is disclosed. The light emitting device package includes a lens, a refraction portion disposed under the lens, and a light emitting device disposed under the refraction portion, wherein the lens includes a top surface, a bottom surface opposite to the top surface, an upper recess formed in the top surface, and a lower recess formed in the bottom surface, the refraction portion is disposed at a first bottom surface of the bottom surface, the first bottom surface defining the lower recess, and the upper recess, the lower recess, the refraction portion, and the light emitting device are aligned along an optical axis.

18 Claims, 9 Drawing Sheets

(56) References Cited

U.S. PATENT DOCUMENTS

| | | | |
|---|---|---|---|
| 2010/0308354 A1* | 12/2010 | David | H01L 33/507 257/98 |
| 2011/0063857 A1 | 3/2011 | Li et al. | |
| 2011/0292302 A1* | 12/2011 | Park | G02B 19/0071 348/739 |
| 2013/0161672 A1* | 6/2013 | Hsieh | H01L 33/58 257/98 |
| 2013/0193592 A1* | 8/2013 | Peil | F21K 9/00 257/791 |
| 2013/0208442 A1* | 8/2013 | Reiherzer | F21V 9/16 362/84 |
| 2013/0341660 A1* | 12/2013 | Chang | H01L 33/58 257/98 |
| 2014/0306245 A1* | 10/2014 | Hayashi | H01L 33/62 257/88 |
| 2015/0116984 A1* | 4/2015 | Dai | G02F 1/1335 362/97.1 |
| 2015/0145406 A1* | 5/2015 | Li | F21V 3/0481 313/502 |

* cited by examiner (a)          (b)

LIGHT EMITTING DEVICE, LIGHT EMITTING DEVICE PACKAGE INCLUDING THE DEVICE, AND LIGHTING APPARATUS INCLUDING THE PACKAGE

CROSS REFERENCE TO RELATED APPLICATION

This application claims priority under 35 U.S.C. § 119 to Korean Patent Application Nos. 10-2015-0136211 filed on Sep. 25, 2015 and 10-2016-0117942 filed on Sep. 13, 2016, which are hereby incorporated by references as if fully set forth herein.

TECHNICAL FIELD

Embodiments relate to a light emitting device, a light emitting device package including the device, and a lighting apparatus including the package.

BACKGROUND

Group III-V compound semiconductors, such as GaN and AlGaN, have been widely used in the field of optoelectronics and electronic devices since such semiconductors have wide and easily adjustable band gap energy and other advantages.

In particular, a light emitting device, such as a light emitting diode or a laser diode, using a group III-V or II-VI compound semiconductor material may emit various colors owing to the development of thin film growth technology and device materials. For example, the light emitting device may emit high-efficiency white light by using a fluorescent material in conjunction with red light, green light, blue light, and ultraviolet light, or by combining colors. The light emitting device exhibits low power consumption, a semi-permanent lifespan, a short response time, good safety, and environment-friendly characteristics, compared to conventional light sources, such as fluorescent lamps and incandescent lamps.

Consequently, the light emitting device has been variously used in a transmission module of an optical communication system, a light emitting diode backlight unit that substitutes for a cold cathode fluorescence lamp (CCFL) constituting a backlight unit of a liquid crystal display (LCD) display apparatus, a white light emitting diode lighting apparatus that substitutes for fluorescent lamps and incandescent lamps, vehicle headlights, and signal lamps.

A light emitting device (not shown) includes a light emitting structure (not shown), which includes a first conductive semiconductor layer (not shown), an active layer (not shown), and a second conductive semiconductor layer (not shown). A first electrode (not shown) and a second electrode (not shown) are disposed on the first conductive semiconductor layer (not shown) and the second conductive semiconductor layer (not shown), respectively. The light emitting device (not shown) emits light having energy set by the inherent energy band of a material constituting the active layer (not shown) as the result of coupling between electrons injected through the first conductive semiconductor layer (not shown) and holes injected through the second conductive semiconductor layer (not shown). The light emitted from the active layer (not shown) may be changed depending on the composition of the material constituting the active layer. For example, blue light, ultraviolet (UV) light, or deep UV light may be emitted from the active layer (not shown).

In the case in which the light emitting device is used in a lighting apparatus or an LCD backlight unit, a light emitting device package may further include a lens disposed on one surface of the light emitting device in order to widen the viewing angle of the light emitted by the light emitting device.

In general, the lens provided to widen the viewing angle of the light emitted by the light emitting device may be classified as an integrated lens or a separate lens depending on the position of the lens.

FIG. 1 is a view showing a conventional light emitting device package.

The conventional light emitting device package may include a light emitting device 100 for emitting light, the light emitting device 100 including a first conductive semiconductor layer (not shown), an active layer (not shown), and a second conductive semiconductor layer (not shown), a lead frame 222 disposed on one surface of the light emitting device 100 for supporting the light emitting device 100, and a lens 300 disposed outside the light emitting device 100 for refracting the light emitted by the light emitting device 100.

The light emitted by the light emitting device 100 is refracted by the lens 300 and is then output to the outside.

In the conventional light emitting device having the integrated lens described above, however, only a single refraction surface that is capable of adjusting the advancing path of the light emitted by the light emitting device 100 is provided. As a result, freedom in the design of the light emitting device package is reduced, and is limited to widening the viewing angle of the light that is emitted by the light emitting device.

SUMMARY

Embodiments provide a light emitting device that is capable of further widening the viewing angle of light emitted thereby, a light emitting device package including the device, and a lighting apparatus including the package.

In one embodiment, a light emitting device package includes a lens, a refraction portion disposed under the lens, and a light emitting device disposed under the refraction portion, wherein the lens includes a top surface, a bottom surface opposite to the top surface, an upper recess formed in the top surface, and a lower recess formed in the bottom surface, the refraction portion is disposed at a first bottom surface of the bottom surface, the first bottom surface defining the lower recess, and the upper recess, the lower recess, the refraction portion, and the light emitting device are aligned along an optical axis.

The light emitting device package may further include a lead frame disposed under the light emitting device.

The bottom surface of the lens may further include a second bottom surface adjacent to the first bottom surface and facing a top surface of the lead frame.

The second bottom surface of the lens may have a ring-shaped planar shape.

The upper recess, the lower recess, and the light emitting device may at least partially overlap one another in a plane in the thickness direction of the lens.

The lower recess may have an arch-shaped, hemispheric, or dome-shaped section.

The refraction portion may include a first refraction surface contacting the first bottom surface and a second refraction surface facing the light emitting device on the opposite side of the first refraction surface.

The thickness of the refraction portion between the first refraction surface and the second refraction surface may be uniform.

At least a portion of the light emitting device may be received in the lower recess.

A first refractive index of the refraction portion may be larger than a second refractive index of the light emitting device.

The first refractive index of the refraction portion may be larger than a third refractive index of a medium filling the lower recess between the light emitting device and the refraction portion.

The first refractive index of the refraction portion may range from 1.3 to 1.6.

At least one of the first and second refraction surfaces of the refraction portion may have a predetermined roughness.

The light emitting device and the second refraction surface may be spaced apart from each other.

The refraction portion may include at least one selected from among silicon, a synthetic resin, and a fluorescent material.

The light emitting device package may further include a lens adhesion member disposed between the second bottom surface of the lens and the lead frame.

The lead frame may include at least one receiving recess formed in the top surface thereof for receiving the lens adhesion member.

In another embodiment, a light emitting device package includes a lead frame, a plurality of light emitting devices disposed on a top surface of the lead frame, a plurality of refraction portions disposed on the respective light emitting devices, a plurality of lenses disposed on the respective refraction portions, and a lens bridge disposed between the respective lenses on the top surface of the lead frame, wherein each of the lenses includes a top surface, a bottom surface opposite to the top surface, an upper recess formed in the top surface, and a lower recess formed in the bottom surface, each of the refraction portions is disposed at a first bottom surface of the bottom surface, the first bottom surface defining the lower recess, and the upper recess, the lower recess, a corresponding one of the refraction portions, and a corresponding one of the light emitting devices are aligned along an optical axis.

The lens bridge may be formed of the same material as the lenses.

The lens bridge may be integrally formed with the lenses.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Reference will now be made in detail to the preferred embodiments, examples of which are illustrated in the accompanying drawings.

It will be understood that when an element is referred to as being "on" or "under" another element, it can be directly on/under the element, or one or more intervening elements may also be present. When an element is referred to as being "on" or "under," "under the element" as well as "on the element" can be included based on the element.

In addition, relational terms, such as "first," "second," "above" and "below," are used only to distinguish between one subject or element and another subject and element without necessarily requiring or involving any physical or logical relationship or sequence between such subjects or elements.

In light emitting devices according to embodiments, a first electrode for supplying current to a first conductive semiconductor layer may be disposed below a light emitting structure to reduce the extent to which the light emitted above the light emitting structure is reflected, and a first electrode may extend through a second conductive semiconductor layer and an active layer so as to be electrically connected to the first conductive semiconductor layer.

Figure 1:
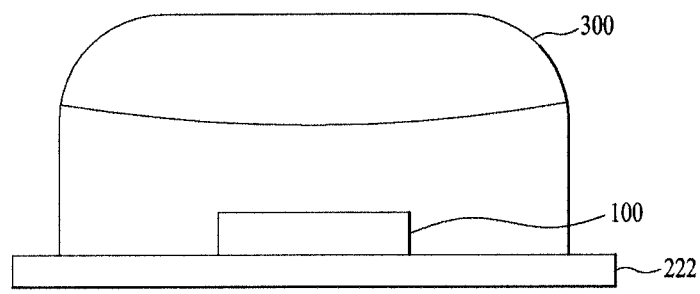
FIG. 1 is a view showing a conventional light emitting device package.
Figure 2A:
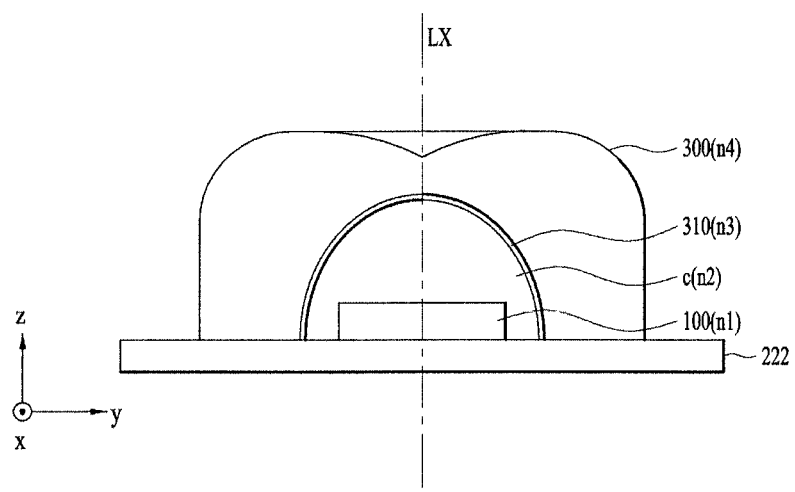
FIG. 2A is an assembled sectional view of a light emitting device package according to an embodiment.
Figure 2B:
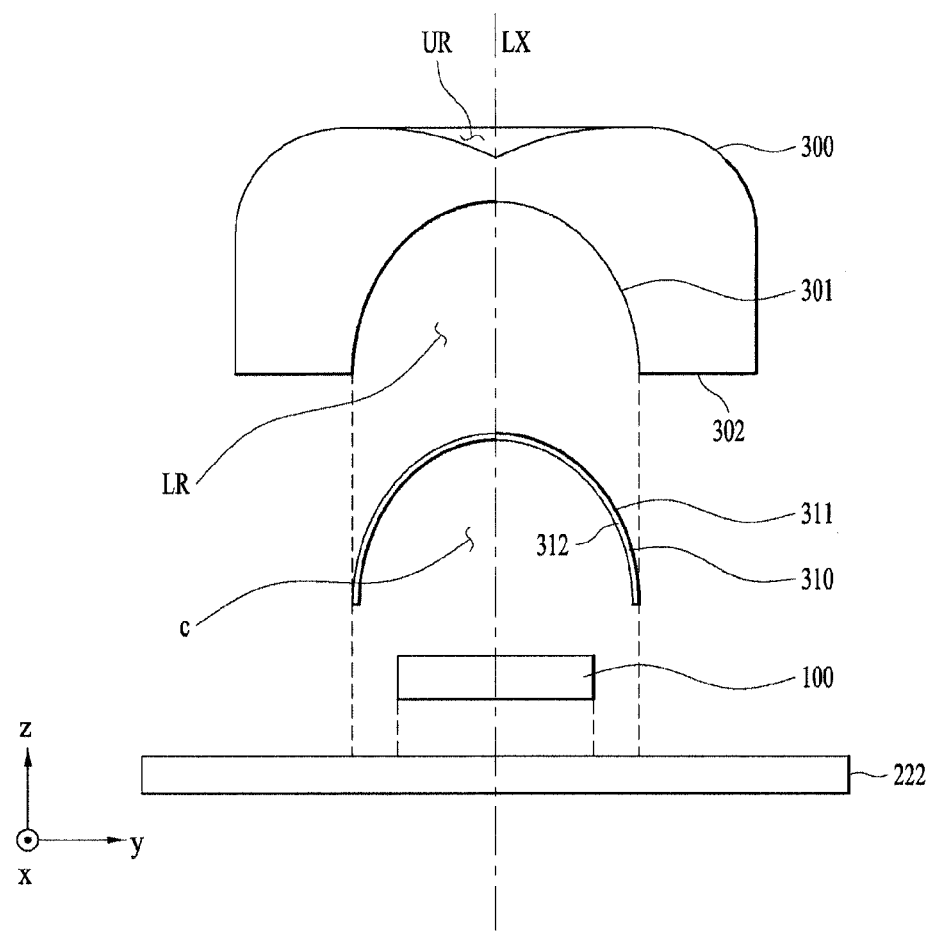
FIG. 2B is an exploded sectional view of the light emitting device package shown in FIG. 2A.
Figure 2C:
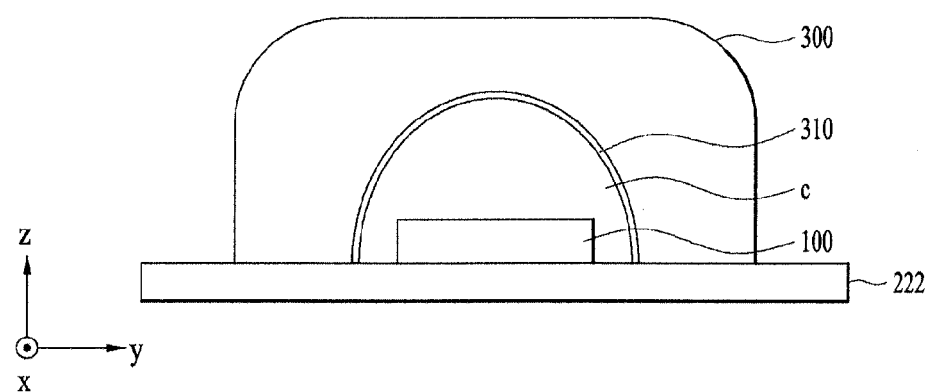
FIG. 2C is an assembled sectional view of a light emitting device package according to anther embodiment.

FIG. 2A is an assembled sectional view of a light emitting device package according to an embodiment, FIG. 2B is an exploded sectional view of the light emitting device package shown in FIG. 2A, and FIG. 2C is an assembled sectional view of a light emitting device package according to anther embodiment.

Referring to FIG. 2A, a light emitting device package according to an embodiment may include a light emitting device 100 for emitting light, the light emitting device 100 including a first conductive semiconductor layer (not shown), an active layer (not shown), and a second conductive semiconductor layer (not shown), a lead frame 222 disposed at one surface of the light emitting device 100 for supporting the light emitting device 100, a lens 300 disposed outside the light emitting device 100 for refracting the light emitted by the light emitting device 100, and a refraction portion 310 disposed between the light emitting device 100 and the lens 300 for refracting the light emitted by the light emitting device 100.

The light emitting device 100 may be mounted on the lead frame 222. The light emitting device 100 emits light. The light emitting device 100 may include at least one selected from between a light emitting diode (LED) chip and a laser diode (LD) chip. However, the disclosure is not limited thereto. The LED chip may be a blue LED chip, an ultraviolet LED chip, or a package including one or more selected from among a red LED chip, a green LED chip, a blue LED chip, a yellow green LED chip, and a white LED chip.

The light emitting device 100 may be aligned with the lens 300 in the optical axis LX direction (e.g., in the z-axis direction). However, the disclosure is not limited thereto. The light emitting device 100 may be a top view type light emitting diode. Alternatively, the light emitting device 100 may be a side view type light emitting diode.

Meanwhile, the lens 300 may be disposed above the light emitting device 100 and the lead frame 222 to widen or narrow the viewing angle of the light that is emitted by the light emitting device 100 and is transmitted through the refraction portion 310.

Referring to FIG. 2B, the bottom surface of the lens 300 may include a first bottom surface 301 and a second bottom surface 302. In addition, the lens 300 may include an upper recess UR formed in the upper surface thereof and a lower recess LR formed in the bottom surface thereof.

The upper recess UR, the lower recess LR, and the light emitting device may be aligned with one another along the optical axis LX. In addition, the upper recess UR, the lower recess LR, and the light emitting device may at least partially overlap one another in the thickness direction of the lens 300. Hereinafter, the recesses and the bottom surface will be described in more detail.

The upper recess UR may have a sectional shape that is appropriate for reflecting and refracting the light emitted by the light emitting device 100 and transmitted through the refraction portion 310. However, the disclosure is not limited thereto. In another embodiment, as shown in FIG. 2C, the upper recess may be omitted from the lens 300.

The first bottom surface 301 may define the lower recess LR. The first bottom surface 301 may have an arch-shaped, hemispheric, or dome-shaped section. However, the disclosure is not limited thereto. The second bottom surface 302 may face the top surface of the lead frame 222. The second bottom surface 302 may be disposed so as to be adjacent to the first bottom surface 301.

The lower recess LR may be disposed so as to form an opening adjacent to the second bottom surface 302 of the lens 300 about the optical axis LX. That is, the lower recess LR may be disposed so as to form an opening in the center of the bottom surface of the lens 300 such that the opening is open in the negative z-axis direction. In the case in which the lower recess LR is disposed so as to have a circular plane about the optical axis LX, therefore, the first bottom surface 301 also has a circular plane about the optical axis LX, and the second bottom surface 302 has a ring-shaped plane about the first bottom surface 301. However, the disclosure is not limited thereto. In other embodiments, the lower recess LR may be disposed so as to have a polygonal shape, a cylindrical shape, or a conical shape, other than a hemispherical shape or a dome shape, while having an opening formed in the bottom surface of the lens 300 depending on a desired light path (i.e. a desired viewing angle).

The lens 300 may have at least one selected from among a spherical shape, an aspherical shape, a freeform curve shape, a polygonal shape, such as a quadrangular shape, a hyperbolic shape, an elliptical shape, and a Fresnel lens shape. However, the disclosure is not limited thereto. The freeform curve shape may be a shape having various curved surfaces.

In addition, the lens 300 may include a transparent material. For example, the lens 300 may include at least one selected from among glass, silicon epoxy, $Al_2O_3$, PDMS, polycarbonate (PC), and an acrylic resin such as polymethylmethacrylate (PMMA).

Meanwhile, the refraction portion 310 may be disposed on the first bottom surface 301 of the lens 300 in the form of a film (thin film) to change the advancing path of the light emitted by the light emitting device 100. More specifically, the refraction portion 310 may include a first refraction surface 311 contacting the first bottom surface 301 and a second refraction surface 312 facing the light emitting device 100 on the opposite side of the first refraction surface 311. Since the first refraction surface 311 is disposed on the first bottom surface 301, the first refraction surface 311 may have the same sectional shape as the first bottom surface 301. The thickness of the refraction portion 310 between the first refraction surface 311 and the second refraction surface 312 may be uniform or nonuniform.

The refraction portion 310 may include a cavity c formed in the lower part thereof. The cavity c of the refraction portion 310 may define an opening formed in at least a portion of the bottom of the refraction portion 310 about the optical axis LX. In addition, the cavity c may have a sectional shape similar to the sectional shape of the lower recess LR (i.e. an arch-shaped, hemispherical, or dome-shaped sectional shape), since the refraction portion 310 is disposed on the first bottom surface 301 of the lens 300 in the form of a film. However, the disclosure is not limited thereto. For example, the cavity c may have a shape different from the shape of the lower recess LR depending on the desired viewing angle.

Meanwhile, the second refraction surface 312 of the refraction portion 310 may be disposed so as not to contact the light emitting device 100. However, the disclosure is not limited thereto. The light emitting device 100 may be received in the cavity c, which may mean that at least a portion of the light emitting device 100 is received in the lower recess LR.

In the conventional light emitting device package described above, only the lens 300 is provided outside the light emitting device 100, whereby only a single refraction surface that is capable of adjusting the advancing path of the light emitted by the light emitting device 100 is provided (i.e. between the top surface of the lens and air outside the lens). As a result, freedom in the design of the light emitting device package is reduced, that is, it is limited to widening the viewing angle of the light that is emitted by the light emitting device 100. In the light emitting device package according to this embodiment, on the other hand, the refraction portion 310 is disposed between the lens 300 and the light emitting device 100, and has one or more refraction surfaces that further refract light. Consequently, it is possible to further widen the viewing angle of the light that is emitted by the light emitting device 100.

Referring to FIG. 2A, the refractive index n3 of the refraction portion 310 may be equal to or different from the refractive index n4 of the lens 300.

In addition, the refractive index n3 of the refraction portion 310 may be smaller or larger than the refractive index n1 of the light emitting device 100. For example, the refractive index n3 of the refraction portion 310 may be 1.3 to 1.6. In addition, the refractive index n3 of the refraction portion 310 may be larger than the refractive index n2 of a medium filling the cavity c. The medium filling the cavity c may be air. However, the disclosure is not limited thereto.

In addition, the refractive index n4 of the lens 300 may be larger than the refractive index n2 of the medium filling the cavity c.

The reason for this is to impart light emitted from the inner active layer (not shown) of the light emitting device 100 with a wider viewing angle when the light is refracted while passing through the light emitting device 100, the cavity c, the refraction portion 310, and the lens 300 in that order, after which the light is output to the outside.

That is, the refractive indices may be gradually reduced from the light emitting device 100 to the lens 300 (except the cavity). That is, the relationship between the refractive indices may be expressed as follows: $n_1 > n_3 \approx n_4 > n_2$. However, the disclosure is not limited thereto. It is obvious to those skilled in the art that the refractive indices may be changed as needed such that the light passing through the first refraction surface 311 and the second refraction surface 312 corresponds to a desired viewing angle.

In addition, the refraction portion 310 may include a synthetic resin, such as plastic, or silicon. In other embodiments, the refraction portion 310 may further include a fluorescent material. For example, silicon may be mixed with a fluorescent material in order to manufacture the refraction portion 310.

A method of coating a light emitting device 100 that emits blue light with a fluorescent material in order to emit white light through the light emitting device 100 has been proposed. In the case in which the fluorescent material is coated using the conventional method, however, a considerable amount of light emitted by the light emitting device 100 for emitting blue light is dissipated from the rear surface thereof as heat. Furthermore, the fluorescent material directly contacts the light emitting device 100 in a sealed structure, with the result that the fluorescent material may become discolored and the light conversion efficiency thereof may be reduced.

In this embodiment, on the other hand, the refraction portion 310 is injection-molded in the state in which a material for manufacturing the refraction portion 310 is mixed with a fluorescent material. As a result, the fluorescent material is formed on the surface of the refraction portion 310, rather than on the surface of the light emitting device 100. Consequently, the loss of light is reduced and color stability is improved, whereby it is possible to manufacture a white light source having high color uniformity.

Figure 3:
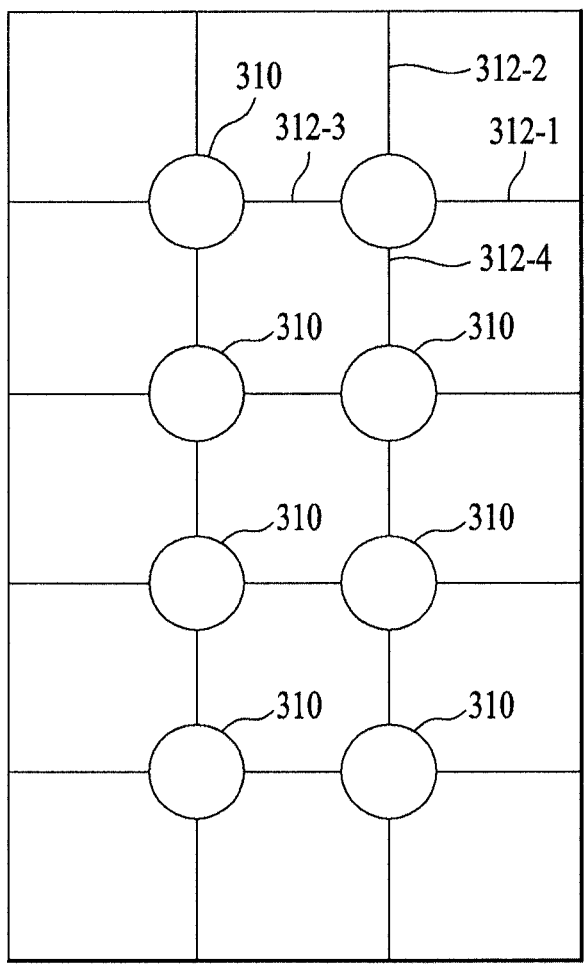
FIG. 3 is a view showing a plurality of refraction portions according to an embodiment.
Figure 3:
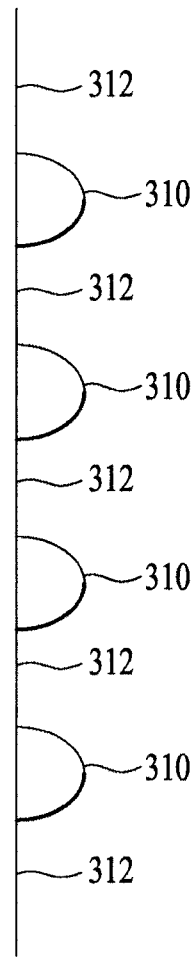

FIGS. 3(a) and 3(b) show a plurality of refraction portions 310.

Referring to FIGS. 3(a) and 3(b), the refraction portions 310 may be manufactured by injection molding.

More specifically, the refraction portions 310 may be simultaneously injection-molded as a single unit, instead of individually injection-molding the refraction portions 310.

In the case in which the refraction portions 310 are simultaneously injection-molded as a single unit, manufacturing costs may be reduced and the quality of the refraction portions 310 may be simultaneously controlled.

For example, as shown in FIGS. 3(a) and 3(b), eight refraction portions 310 may be manufactured so as to constitute a single unit (hereinafter, referred to as a "refraction unit" for the sake of convenience) in a plane.

The refraction unit may include bridges 312 protruding from each refraction portion 310 in every direction.

The bridges 312 may include a first bridge 312-1 protruding from each refraction portion 310 in a first direction, a second bridge 312-2 protruding from each refraction portion 310 in a second direction perpendicular to the first direction, a third bridge 312-3 protruding from each refraction portion 310 in a third direction perpendicular to the second direction and opposite to the first direction, and a fourth bridge 312-4 protruding from each refraction portion 310 in a fourth direction perpendicular to the third direction and opposite to the second direction.

However, the disclosure is not limited thereto. The number of refraction portions 310, the number of bridges 312, and the directions in which the bridges 312 protrude may be changed.

Figure 4:
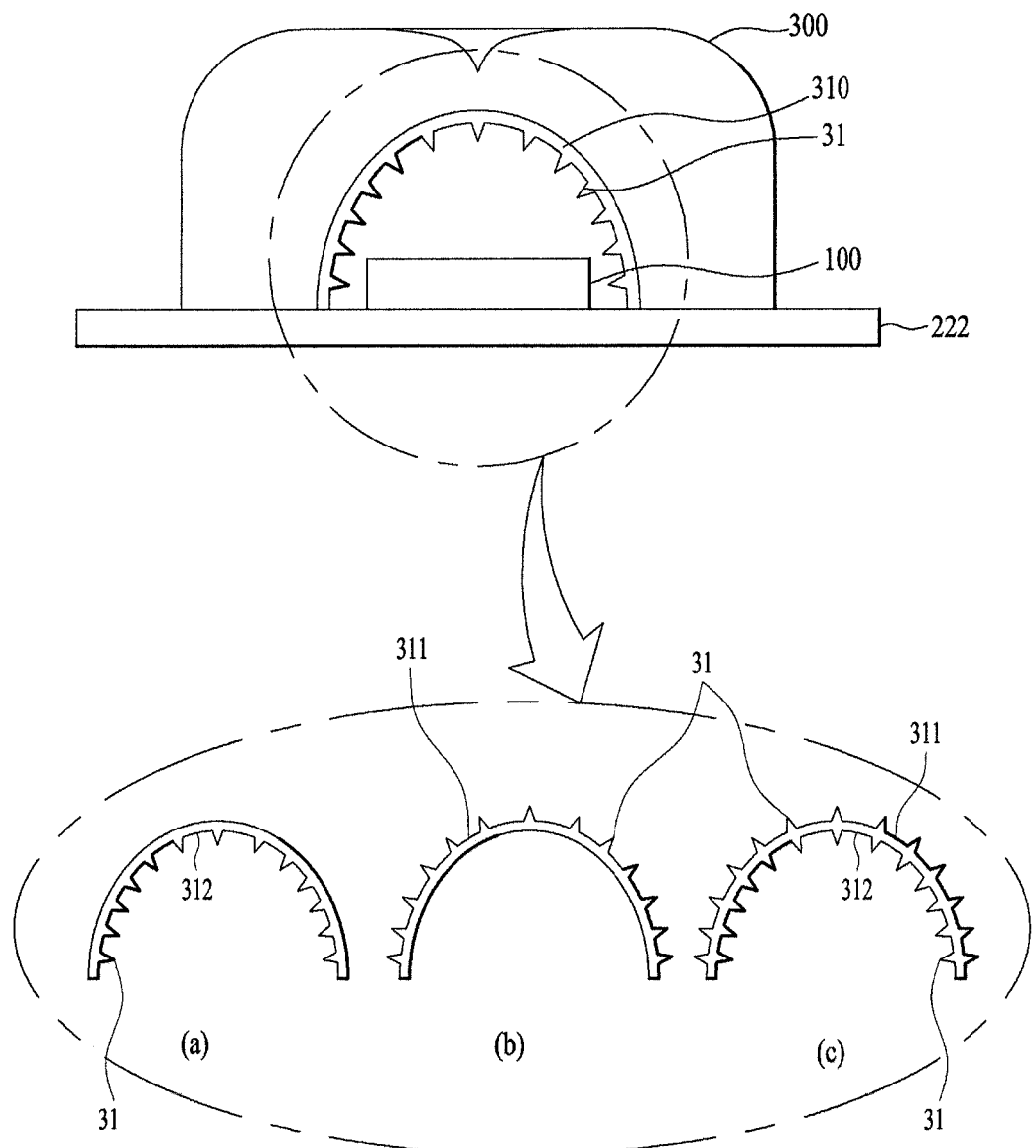
FIG. 4 is a view showing various examples of the refraction portion according to an embodiment.

FIG. 4 is a view showing various examples of the refraction portion.

Referring to FIG. 4, the refraction portion 310 may include a predetermined roughness 31 formed on one surface thereof.

As shown in FIG. 4(a), the roughness 31 may be formed on the second refraction surface 312 of the refraction portion 310.

As shown in FIG. 4(b), the roughness 31 may be formed on the first refraction surface 311 of the refraction portion 310.

As shown in FIG. 4(c), the roughness 31 may be formed on each of the first refraction surface 311 and the second refraction surface 312 of the refraction portion 310.

Although not shown, the roughness 31 may be formed on a portion of one surface of the refraction portion 310.

In the case in which the roughness 31 is formed on at least one surface of the refraction portion 310, the light emitted by the light emitting device 100 may be diffused more efficiently.

Although not shown, one surface of the refraction portion 310 may be patterned so as to change the advancing path of the light emitted by the light emitting device 100.

As a result, the viewing angle, at which the light emitted by the light emitting device 100 is output through the light emitting device package, may be widened.

Figure 5:
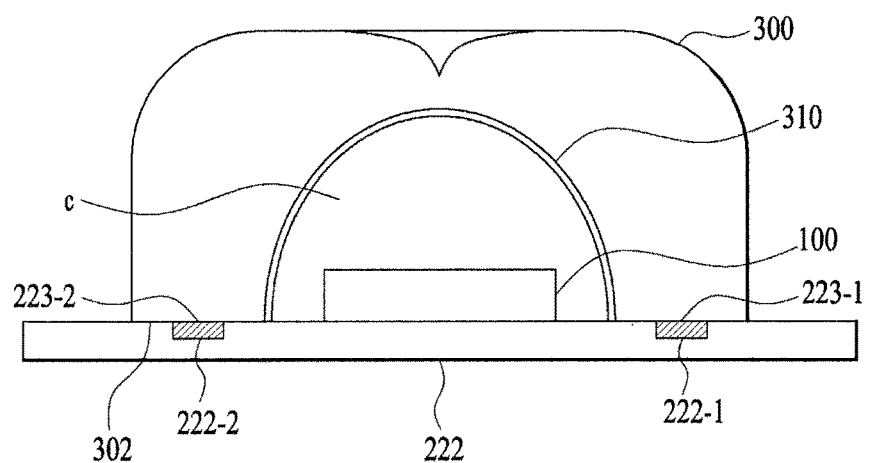
FIG. 5 is a view showing the light emitting device package according to an embodiment.
Figure 6:
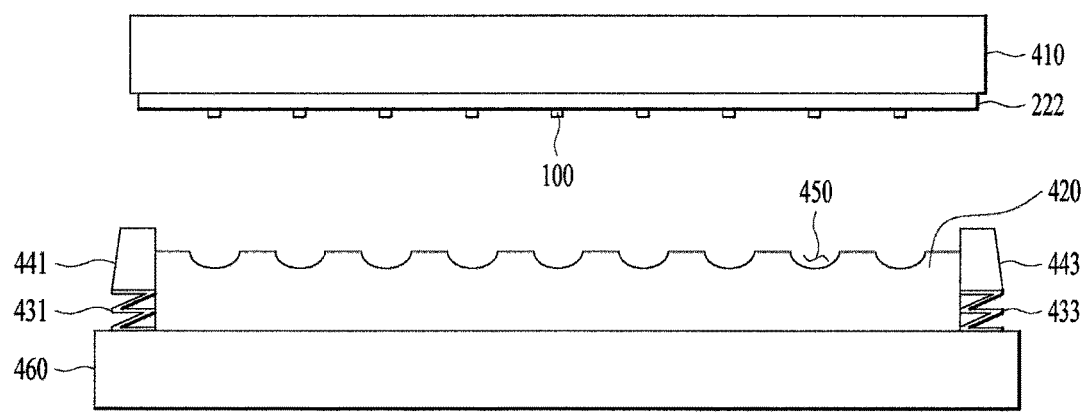
FIGS. 6 to 10B are views showing a process of manufacturing the light emitting device package according to an embodiment.
Figure 7:
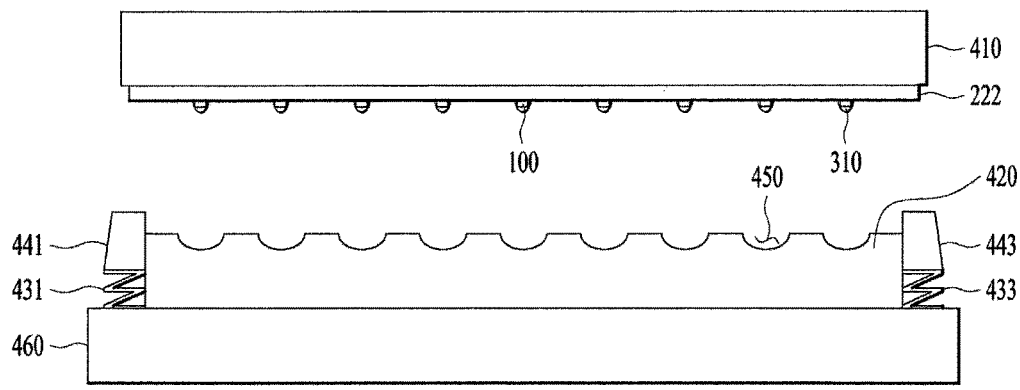
Figure 8:
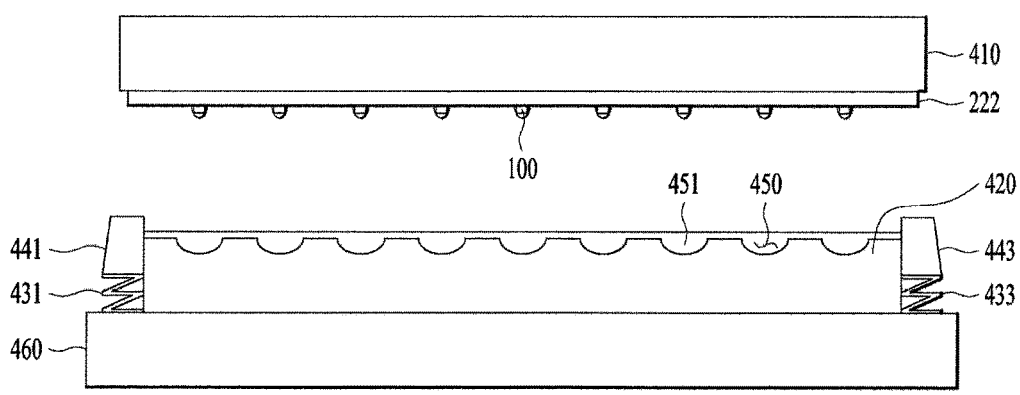
Figure 9:
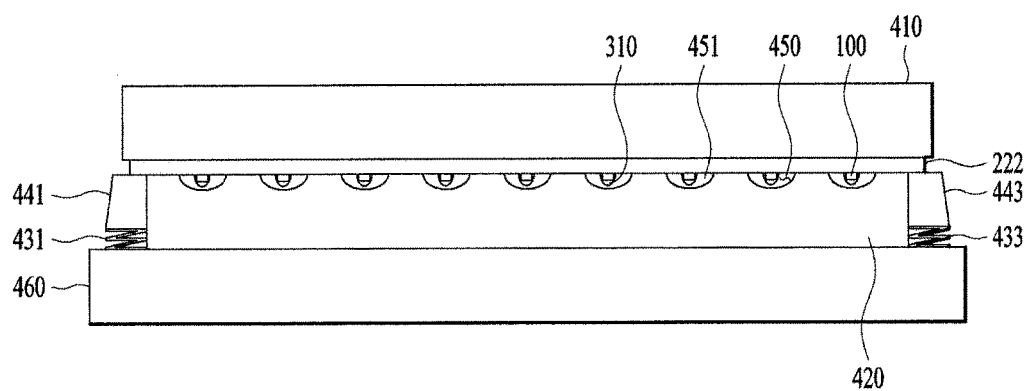

FIG. 5 is a view showing the light emitting device package according to the embodiment.

Referring to FIG. 5, the second bottom surface 302 of the lens 300 may be securely coupled to the lead frame 222 via lens adhesion members 223-1 and 223-2. To this end, the lead frame 222 may include receiving recesses 222-1 and 222-2 formed in the top surface thereof for receiving the lens adhesion members 223-1 and 223-2.

In the case in which the receiving recesses 222-1 and 222-2 are provided, the lens adhesion members 223-1 and 223-2 may be prevented from being introduced into the cavity c, which is a space in which the light emission performance of the light emitting device package may be reduced if the lens adhesion members 223-1 and 223-2 are introduced into the cavity c.

Figure 10A:
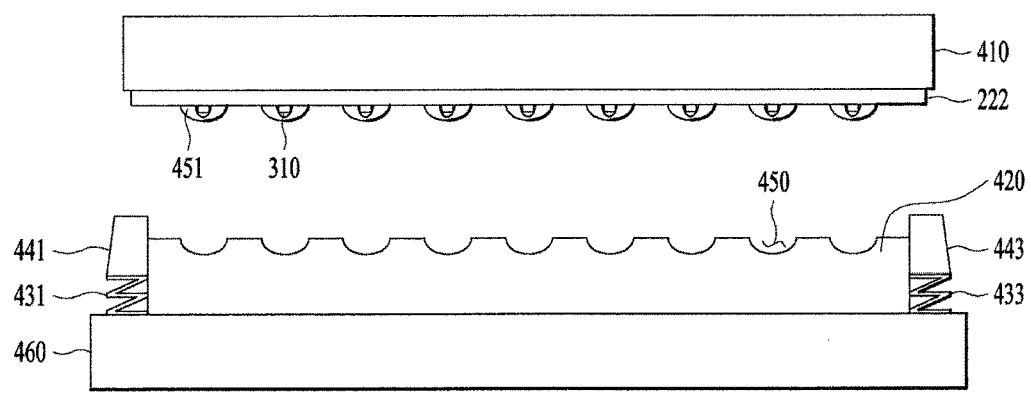
Figure 10B:
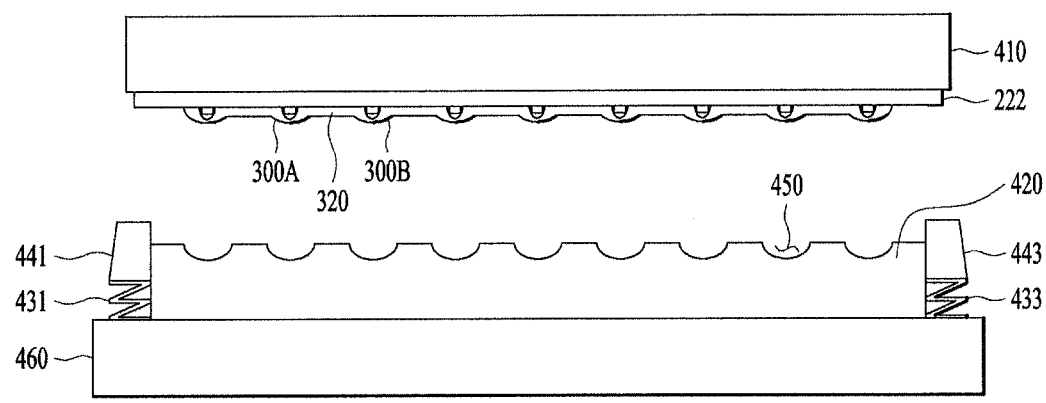
Figure 11:
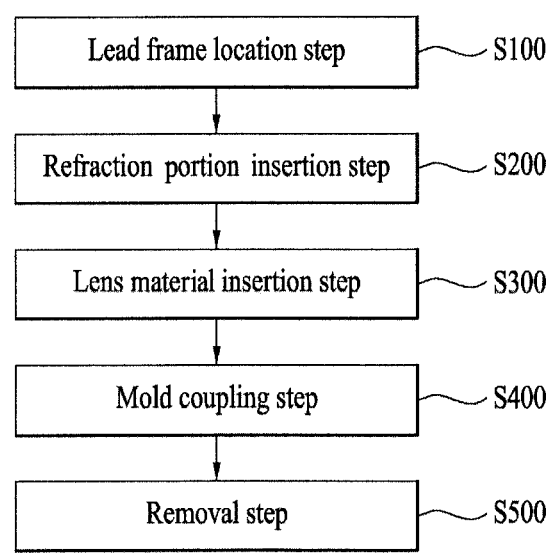
FIG. 11 is a flowchart showing a method of manufacturing the light emitting device package according to an embodiment.

FIGS. 6 to 10B are views showing a process of manufacturing the light emitting device package according to the embodiment, and FIG. 11 is a flowchart showing a method of manufacturing the light emitting device package according to the embodiment.

Referring to FIGS. 6 to 11, an apparatus for manufacturing the light emitting device package according to the embodiment may include an upper mold 410 for receiving a plurality of light emitting device packages 200 in one surface thereof, a lower mold 420 disposed to correspond to the upper mold 410 so as to form a lens 300 on one surface of each light emitting device package 200 together with the upper mold 410, a support unit 440 disposed at one side of the lower mold 420 for supporting one surface of the upper mold 410, an elastic unit 430 disposed on one surface of the support unit 440 for providing elastic force to the upper mold 410 via the support unit 440, and a base 460 for supporting the lower mold 420 and the elastic unit 430.

The lower mold 420 may include concave parts 450 formed in one surface thereof for providing spaces in which lens materials 451 are received.

The support unit 440 may include a first support unit 441 for supporting one end of the upper mold 410 and a second support unit 443 for supporting the other end of the upper mold 410.

The elastic unit 430 may include a first elastic unit 431 for providing elastic force to one end of the upper mold 410 via the first support unit 441 and a second elastic unit 433 for providing elastic force to the other end of the upper mold 410 via the second support unit 443.

Hereinafter, a method of manufacturing light emitting device packages 200 will be described.

The method of manufacturing light emitting device packages 200 may include a lead frame location step (S100) of locating a lead frame 222, in which a plurality of light emitting devices 100 is received, at the upper mold 410, a refraction portion insertion step (S200) of inserting refraction portions 310 such that the light emitting devices 100, located at the upper mold 410, are received in cavities formed in the refraction portions 310, a lens member insertion step (S300) of inserting liquid-phase lens materials 451, i.e. lens materials 451 that have not yet hardened, into concave parts 450 formed in the lower mold 410, a mold coupling step (S400) of coupling the upper mold 410 to the lower mold 420 such that the top surfaces of the refraction portions 310 are immersed in the lens materials 451, and a removal step (S500) of decoupling the upper mold 410 from the lower mold 420 to remove light emitting device packages 200 after a predetermined time during which the lens materials 451 are solidified.

At the mold coupling step (S400), the lens materials 451 are prevented from being introduced into the cavities by the refraction portions 310. In addition, since the lens materials 451 are solidified in the state of tightly contacting the upper surfaces, i.e. the first refraction surfaces, of the refraction portions 310, the shape of the lower recess LR and the first bottom surface 301 of each of the lenses 300 may be set depending on the shape of a corresponding one of the first refraction surfaces.

At the removal step (S500) of removing the light emitting device packages 200, light emitting device packages 200 may have various shapes depending on the shape of each of the concave parts 450 formed in the lower mold 420 and the amount of lens materials 451 supplied to the concave parts 450.

More specifically, in the case in which the amount of lens materials 451 supplied to the concave parts 450 is a first supply amount set to form the lens 300 shown in FIGS. 2, 4, and 5, the portion of the lead frame 222 at which the lens 300 is not formed may be exposed outward, as shown in FIGS. 2, 4, and 5.

In the case in which the amount of lens materials 451 supplied to the concave parts 450 is a second supply amount larger than the first supply amount, on the other hand, the portion of the lead frame 222 at which the lens 300 is not formed may not be exposed outward.

That is, the light emitting devices 100 may be disposed on the lead frame 222 so as to be spaced apart from each other by a predetermined distance in the state of being received in the respective refraction portions. When the lens materials 451 are hardened on the respective refraction portions to form lenses, a lens bridge may be formed between the respective lenses on the lead frame 222 as the result of hardening of the lens materials 451.

For example, as shown in FIG. 10B, the light emitting device packages 200 may include a first lens 300A, which is one of the lenses 300 provided on the light emitting devices 100, a second lens 300B disposed adjacent to the first lens 300A, and a lens bridge 320 disposed between the first lens 300A and the second lens 300B.

The lens bridge 320 may be formed of the same material as the lenses 300.

The lens bridge 320 of the light emitting device packages 200, provided on the lead frame 222, may protect the lead frame 222 from external impact.

Alternatively, an additional protective layer may be provided to protect the lead frame 222 from external impact. In this embodiment, the lens bridge 320 is provided on one surface of the lead frame 222 at the time of forming the lenses 300 of the light emitting device packages 200, thereby improving process efficiency.

The lens member insertion step (S300) may include a fluorescent material mixing step (not shown) of mixing a fluorescent material with a material for manufacturing the refraction portions 310, as previously described.

However, the disclosure is not limited thereto. The apparatus and process for manufacturing the light emitting device packages 200 may be changed as needed.

Figure 12:
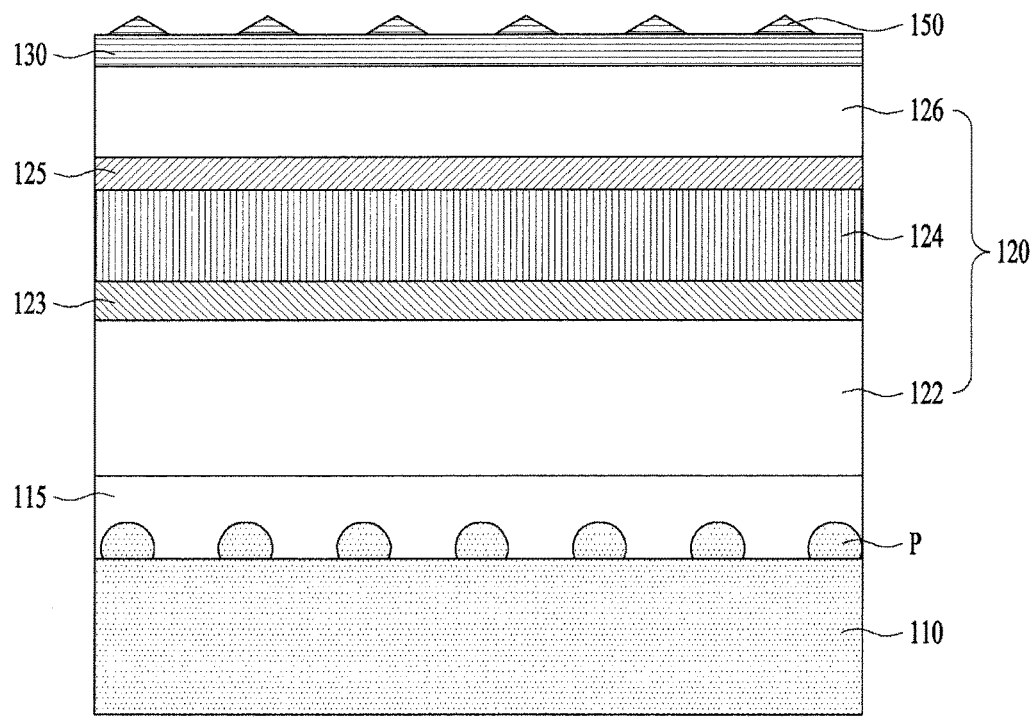
FIG. 12 is a view showing a light emitting device according to an embodiment.

FIG. 12 is a view showing a light emitting device according to an embodiment.

Referring to FIG. 12, a substrate 110 may be formed of a material that is appropriate for growing a semiconductor material, such as a carrier wafer. In addition, the light emitting device may be formed of a material exhibiting high thermal conductivity. The substrate 110 may be a conductive substrate or an insulative material. For example, the substrate 110 may be formed of at least one selected from among sapphire ($Al_2O_3$), SiC, Si, GaAs, GaN, ZnO, GaP, InP, Ge, and $Ga_2O_3$. However, the disclosure is not limited thereto.

In the case in which a GaN compound semiconductor layer is formed on the substrate 110, a GaN substrate may be used. The GaN substrate may reduce the difference in lattice constant with the GaN compound semiconductor layer, making low-defect, high-quality epitaxial growth possible. The GaN substrate may be a polarized, half-polarized, or non-polarized substrate.

An irregular structure P may be formed on the substrate 110. For example, the substrate may be a patterned sapphire substrate (PSS). The irregular structure formed on the sapphire substrate by patterning may induce the diffuse reflection of light on the surface of the substrate, thereby improving the light extraction efficiency of the light emitting structure.

A buffer layer 115 may be disposed on the substrate 110. The buffer layer 115 may reduce the differences in lattice unconformity and thermal expansion coefficient between the substrate 110 and the conductive semiconductor layer. The buffer layer 115 may be formed of at least one selected from among group III-V compound semiconductors, such as GaN, InN, AlN, InGaN, AlGaN, InAlGaN, and AlInN.

An undoped semiconductor layer (not shown) may be formed on the buffer layer 115. However, the disclosure is not limited thereto.

A light emitting structure 120, including a first conductive semiconductor layer 122, an active layer 124, and a second conductive semiconductor layer 126, may be formed on the substrate 110 or the buffer layer 115.

The light emitting structure 120 may be formed using various methods, such as Metal Organic Chemical Vapor Deposition (MOCVD), Chemical Vapor Deposition (CVD), Plasma-Enhanced Chemical Vapor Deposition (PECVD), Molecular Beam Epitaxy (MBE), and Hydride Vapor Phase Epitaxy (HVPE). However, the disclosure is not limited thereto.

The first conductive semiconductor layer 122 may be formed of a group III-V or II-VI compound semiconductor, and may be doped with a first conductive dopant. The first conductive semiconductor layer 122 may be formed of at least one selected from a semiconductor having a formula of $Al_xIn_yGa_{(1-x-y)}N$ ($0 \leq x \leq 1$, $0 \leq y \leq 1$, and $0 \leq x+y \leq 1$), AlGaN, GaN, InAlGaN, AlGaAs, GaP, GaAs, GaAsP, and AlGaInP.

In the case in which the first conductive semiconductor layer 122 is an n-type semiconductor layer, the first conductive dopant may include an n-type dopant, such as Si, Ge, Sn, Se, or Te. The first conductive semiconductor layer 122 may have a single layer or multiple layers.

The first conductive semiconductor layer 122 may be formed by injecting a silane gas ($SiH_4$), including an n-type dopant, such as a trimethylgallium gas (TMGa), an ammonia gas ($NH_3$), a nitrogen gas ($N_2$), or silicon (Si), in a chamber.

A current diffusion layer 123 may be formed on the first conductive semiconductor layer 122 of the light emitting structure. The current diffusion layer 123 may be an undoped GaN layer. However, the disclosure is not limited thereto.

An electron injection layer (not shown) may be formed on the current diffusion layer 123. The electron injection layer may be a first conductive GaN layer.

In addition, a strain control layer (not shown) may be formed on the electron injection layer. For example, a strain control layer, formed of $In_yAl_xGa_{(1-x-y)}N (0 \leq x \leq 1$ and $0 \leq y \leq 1)$/GaN, may be formed on the electron injection layer.

The strain control layer may reduce the stress induced by lattice unconformity between the first conductive semiconductor layer 122 and the active layer 124.

The active layer 124 may be formed on the first conductive semiconductor layer 122 or the strain control layer.

The active layer 124 may be disposed between the first conductive semiconductor layer 122 and the second conductive semiconductor layer 126.

The active layer 124 is a layer in which electrons and holes are coupled in order to emit light having energy set by the inherent energy band of a material constituting the active layer (i.e. the light emitting layer). In the case in which the first conductive semiconductor layer 122 is an n-type semiconductor layer and the second conductive semiconductor layer 126 is a p-type semiconductor layer, electrons may be injected from the first conductive semiconductor layer 122, and holes may be injected from the second conductive semiconductor layer 126.

The active layer 124 may include any one selected from among a single well structure, a double hetero structure, a multi well structure, a single quantum well structure, a multi quantum well (MQW) structure, a quantum-wire structure, and a quantum dot structure.

A well layer/barrier layer of the active layer 124 may include one or more pairs of structures selected from among AlGaN/AlGaN, InGaN/GaN, InGaN/InGaN, AlGaN/GaN, InAlGaN/GaN, GaAs(InGaAs)/AlGaAs, and GaP(InGaP)/AlGaP, which are group III-V compound semiconductor materials. However, the disclosure is not limited thereto. The well layer may be formed of a material having a narrower band gap than the barrier layer.

A conductive clad layer (not shown) may be disposed on and/or under the active layer 124. The conductive clad layer may be formed of a semiconductor having a wider band gap than the barrier layer of the active layer 124. For example, the conductive clad layer may include GaN, AlGaN, InAlGaN, or a superlattice structure. In addition, the conductive clad layer may be doped as an n-type or p-type semiconductor.

The second conductive semiconductor layer 126 may be formed of a compound semiconductor. The second conductive semiconductor layer 126 may be embodied by a group III-V or II-VI compound semiconductor. The second conductive semiconductor layer 126 may be doped with a second conductive dopant.

The second conductive semiconductor layer 126 may be formed of at least one selected from among a semiconductor material having a formula of $In_xAl_yGa_{1-x-y}N$ ($0 \leq x \leq 1$, $0 \leq y \leq 1$ and $0 \leq x+y \leq 1$), AlGaN, GaN AlInN, AlGaAs, GaP, GaAs, GaAsP, and AlGaInP. For example, the second conductive semiconductor layer 126 may be formed of $Al_xGa_{(1-x)}N$.

In the case in which the second conductive semiconductor layer 126 is a p-type semiconductor layer, the second conductive dopant may be a p-type dopant, such as Mg, Zn, Ca, Sr, or Ba.

The second conductive semiconductor layer 126 may have a single layer or multiple layers. The second conductive semiconductor layer 126, such as a p-type GaN layer, may be formed by injecting bis(ethylcyclopentadienyl)magnesium $(EtCp_2Mg)\{Mg(C_2H_5C_5H_4)_2\}$, including a p-type dopant, such as a trimethylgallium gas (TMGa), an ammonia gas ($NH_3$), a nitrogen gas ($N_2$), or magnesium (Mg), in a chamber. However, the disclosure is not limited thereto.

In the case in which the second conductive semiconductor layer 126 is a p-type semiconductor layer, a semiconductor layer having a polarity opposite to the polarity of the second conductive semiconductor layer 126, such as an n-type semiconductor layer, may be formed on the second conductive semiconductor layer 126. Consequently, the light emitting structure 120 may be formed to have any one selected from among an n-p junction structure, a p-n junction structure, an n-p-n junction structure, and a p-n-p junction structure.

An electron blocking layer 125 may be disposed between the active layer 124 and the second conductive semiconductor layer 126 so as to be adjacent to the active layer 124.

The electron blocking layer 125 may include AlGaN, and may be doped with a second conductive dopant.

In addition, the electron blocking layer 125 may include $Al_zGa_{(1-z)}N/GaN (0 \leq x \leq 1)$ or a superlattice structure. However, the disclosure is not limited thereto. The electron blocking layer 125 may efficiently block p-type electrons that are injected and overflow, thereby improving hole injection efficiency.

A conductive layer 130 may be disposed on the second conductive semiconductor layer 126 of the light emitting structure 120. In addition, a second electrode (not shown) may be formed on the second conductive semiconductor layer 126 or the conductive layer 130.

The conductive layer 130 may improve the electrical properties of the second conductive semiconductor layer 126 and electrical contact with the second electrode (not shown). The conductive layer 130 may have a plurality of layers or may be patterned. The conductive layer 130 may be a transparent electrode layer having transparency.

The conductive layer 130 may include at least one selected from among Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IZO Nitride (IZON), Al—Ga ZnO (AGZO), In—Ga ZnO (IGZO), Zinc Oxide (ZnO), Iridium Oxide (IrOx), Ruthenium Oxide (RuOx), Nickel Oxide (NiO), RuOx/ITO, and Ni/IrOx/Au (Gold). However, the disclosure is not limited thereto.

A light extraction pattern 150 may be formed on the conductive layer 130. The light extraction pattern 150 may be formed by wet etching or dry etching. The light extraction pattern 150 may improve the light extraction efficiency of the light emitting structure.

As is apparent from the above description, embodiments have the following effects.

In a light emitting device, a light emitting device package including the device, and a lighting apparatus including the package according to embodiments, a wider viewing angle may be provided.

In a light emitting device, a light emitting device package including the device, and a lighting apparatus including the package according to embodiments, the emission angle of the light emitted by the light emitting device may be adjusted using a refraction surface that is additionally provided by a refraction portion.

In a light emitting device, a light emitting device package including the device, and a lighting apparatus including the package according to embodiments, uniform color distribution may be achieved.

In a light emitting device, a light emitting device package including the device, and a lighting apparatus including the package according to embodiments, adhesion between an integrated lens and the light emitting device package may be improved, thereby achieving structural stability.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a lens;
   a refraction portion disposed under the lens;
   a light emitting device disposed under the refraction portion;
   a lead frame disposed under the light emitting device, the lead frame comprising at least one receiving recess formed in a top surface thereof; and
   an adhesion member separate from the lens and disposed in the at least one receiving recess,
   wherein the lens comprises:
   a top surface;
   a bottom surface opposite to the top surface;
   an upper recess formed in the top surface; and
   a lower recess formed in the bottom surface,
   wherein the refraction portion is disposed at a first bottom surface of the bottom surface, the first bottom surface defining the lower recess,
   wherein the upper recess, the lower recess, the refraction portion, and the light emitting device are aligned along an optical axis,
   wherein the bottom surface of the lens further comprises a second bottom surface adjacent to the first bottom surface and facing the top surface of the lead frame,
   wherein the second bottom surface of the lens is in contact with the top surface of the lead frame and a top surface of the adhesion member, and
   wherein the entirety of the second bottom surface of the lens has a ring-shaped planar shape.

2. The light emitting device package according to claim 1, wherein the upper recess, the lower recess, and the light emitting device at least partially overlap one another in a plane in a thickness direction of the lens.

3. The light emitting device package according to claim 1, wherein the lower recess has an arch-shaped, hemispheric, or dome-shaped section.

4. The light emitting device package according to claim 1, wherein the refraction portion comprises:
   a first refraction surface contacting the first bottom surface; and
   a second refraction surface facing the light emitting device on an opposite side of the first refraction surface.

5. The light emitting device package according to claim 4, wherein a thickness of the refraction portion between the first refraction surface and the second refraction surface is uniform.

6. The light emitting device package according to claim 1, wherein at least a portion of the light emitting device is received in the lower recess.

7. The light emitting device package according to claim 1, wherein a first refractive index of the refraction portion is larger than a third refractive index of a medium filling the lower recess between the light emitting device and the refraction portion.

8. The light emitting device package according to claim 1, wherein the first refractive index of the refraction portion is 1.3 to 1.6.

9. The light emitting device package according to claim 4, wherein at least one of the first and second refraction surfaces of the refraction portion has a predetermined roughness.

10. The light emitting device package according to claim 4, wherein the light emitting device and the second refraction surface are spaced apart from each other.

11. The light emitting device package according to claim 1, wherein the refraction portion comprises at least one selected from among silicon, a synthetic resin, and a fluorescent material.

12. The light emitting device package according to claim 1, wherein an opening of the at least one receiving recess is coplanar with the second bottom surface of the lens.

13. The light emitting device package according to claim 1, wherein an interface between the second bottom surface of the lens and the top surface of the lead frame is coplanar with the top surface of the adhesion member.

14. A light emitting device package comprising:
   a lead frame comprising receiving recesses formed on a top surface thereof;
   a plurality of light emitting devices disposed at the top surface of the lead frame;
   a plurality of refraction portions disposed over respective light emitting devices;
   a plurality of lenses disposed on the respective refraction portions;
   a lens bridge disposed between the respective lenses on the top surface of the lead frame; and
   a plurality of adhesion members, each disposed in a respective one of the receiving recesses,
   wherein each adhesion member is separate from the respective lens,
   wherein each of the lenses comprises:
   a top surface;
   a bottom surface opposite to the top surface;
   an upper recess formed in the top surface; and
   a lower recess formed in the bottom surface,
   wherein each of the refraction portions is disposed at a first bottom surface of the bottom surface, the first bottom surface defining the lower recess, wherein the upper recess, the lower recess, a corresponding one of the refraction portions, and a corresponding one of the light emitting devices are aligned along an optical axis, wherein each of the bottom surfaces of the lenses further comprises a second bottom surface adjacent to the first bottom surface and facing the top surface of the lead frame, and wherein each of the second bottom surfaces of the lenses is in contact with the top surface of the lead frame and a top surface of the respective adhesion members, and wherein the entirety of each of the second bottom surfaces of the lenses has a ring-shaped planar shape.

15. The light emitting device package according to claim 14, wherein the lens bridge is formed of the same material as the lenses.

16. The light emitting device package according to claim 14, wherein the lens bridge is integrally formed with the lenses.

17. The light emitting device package according to claim 14, wherein an opening of at least one of the receiving recesses is coplanar with each of the second bottom surfaces of the lenses.

18. The light emitting device package according to claim 14, wherein an interface between each of the second bottom surfaces of the lenses and the top surface of the lead frame is coplanar with the top surface of the respective adhesion members.

* * * * *